United States Patent [19]

Huston et al.

[11] Patent Number: 6,079,038
[45] Date of Patent: Jun. 20, 2000

[54] METHOD FOR GENERATING A SHMOO PLOT CONTOUR FOR INTEGRATED CIRCUIT TESTER

[75] Inventors: Robert Huston, San Jose, Calif.; Daniel J. Bedell, Portland, Oreg.

[73] Assignee: Credence Systems Corporation, Fremont, Calif.

[21] Appl. No.: 09/065,754

[22] Filed: Apr. 24, 1998

[51] Int. Cl.$^7$ .................................................. G01R 31/28
[52] U.S. Cl. ............................................................ 714/724
[58] Field of Search ................................. 714/724, 723, 714/721, 745

[56] References Cited

PUBLICATIONS

Niewczas, Maly, Strojwas. "A Pattern Matching Algorithm for Verification and Analysis of Very Large IC Layouts", in Proc. of International Symposiumon on Physical Design, Monterey, CA. pp. 129–134, Apr. 1998.

Baker, Van Beers. "Shmoo plotting: the black art of IC testing", IEEE Design & Test of Computers. pp. 90–97, Jul. 1997.

Hamada, Kumanoya, Ishii, Kawagoe, Niiro. "A high–speed boundary search Shmoo plot for ULSI memories", Records of the 1993 IEEE International Workshop on Memory Testing. pp. 4–9, Aug. 1993.

Hickling. "Extending binary searches to two and three dimensions (IC testing)", Proceedings of the 1990 International Test Conference. pp. 721–725, Sep. 1990.

*Primary Examiner*—Albert De Cady
*Assistant Examiner*—Samuel Lin
*Attorney, Agent, or Firm*—Daniel J. Bedell; Smith-Hill and Bedell

[57] ABSTRACT

A method of operating an integrated circuit (IC) tester is disclosed in which an IC is repeatedly tested with respect to a limited number of combinations of values of two variable IC operating parameters (X and Y) to determine the boundary of a two-dimensional range of combinations of values of the X and Y parameters for which the IC passes a test. After finding a combination of X and Y parameter values on the boundary, each combination of parameter values to be tested thereafter is selected by altering either the X or Y parameter value, with the decision based on whether the IC passed the last test and on the manner in which a last tested combination of X and Y parameter values was selected.

18 Claims, 11 Drawing Sheets

METHOD FOR GENERATING A SHMOO PLOT CONTOUR FOR INTEGRATED CIRCUIT TESTER

BACKGROUND OF THE INVENTION

1. Field of the Invention

The present invention relates in general to integrated circuit (IC) testers and in particular to an IC tester that rapidly locates points along an IC's boundaries of operability with respect to two variable operating parameters.

2. Description of Related Art

The newspaper comic strip Lil' Abner was occasionally populated with characters called "Shmoos" noted for their somewhat amorphous shape. The integrated circuit (IC) test industry borrowed the term "Shmoo" as a name for a type of plot produced by some IC testers. A "Shmoo plot" is a graphical representation of an IC's ability to operate properly in response to various combinations of values of two variable operating parameters. For example one might repeatedly test an IC using different combinations of supply voltage and input clock signal frequency for each test to determine the various combinations of values of those operating parameters for which the IC operates properly.

Figure 1:
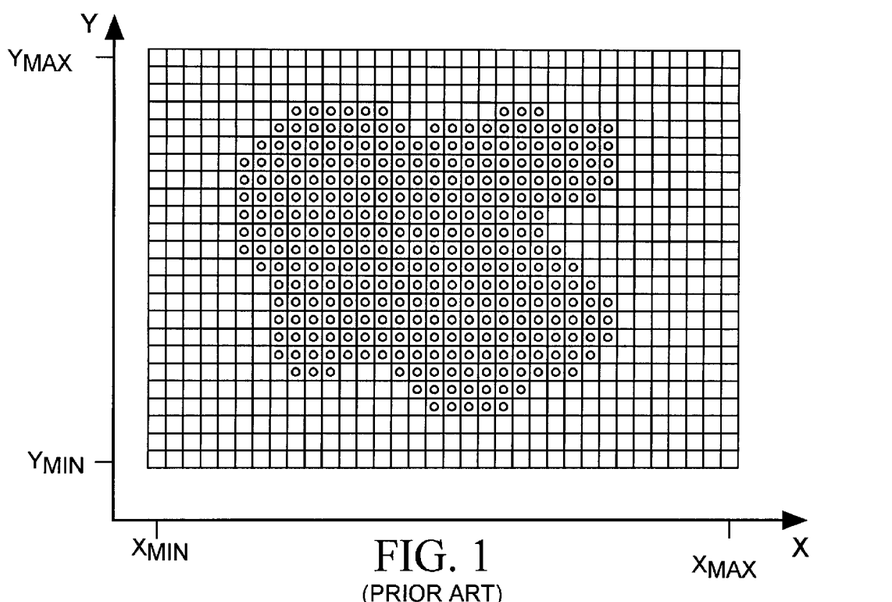
FIG. 1 illustrates a prior art Shmoo plot.

FIG. 1 illustrates a typical Shmoo plot. The horizontal (X) axis of the Shmoo plot represents the value of one test operating parameter, for example supply voltage, and the vertical (Y) axis represents the value of another test operating level parameter, for example clock frequency. To produce enough data for a Shmoo plot, an IC tester must test an IC at every combination of X and Y parameters values within a range of interest bounded by $X_{MIN}$, $X_{MAX}$, $Y_{MIN}$ and $Y_{MAX}$ with some given resolution in X and Y step size. The tester then displays or prints a Shmoo plot graph representing test results for each combination of X and Y values. The tester plots a "pass" symbol (represented in FIG. 1 by a square containing a small circle) when the IC passes a test performed under the combination of test parameters indicated by the symbol's (X,Y) coordinates. The tester plots a "fail" symbol (represented in FIG. 1 by an empty square) when the IC fails a test performed under the combination of test parameters indicated by the symbol's (X,Y) coordinates. Like its namesake, a Shmoo plot often has an irregular shape. But a Shmoo plot is very useful because it clearly depicts the operating limits of an IC with respect to the various combinations of two test parameters.

Figure 2:
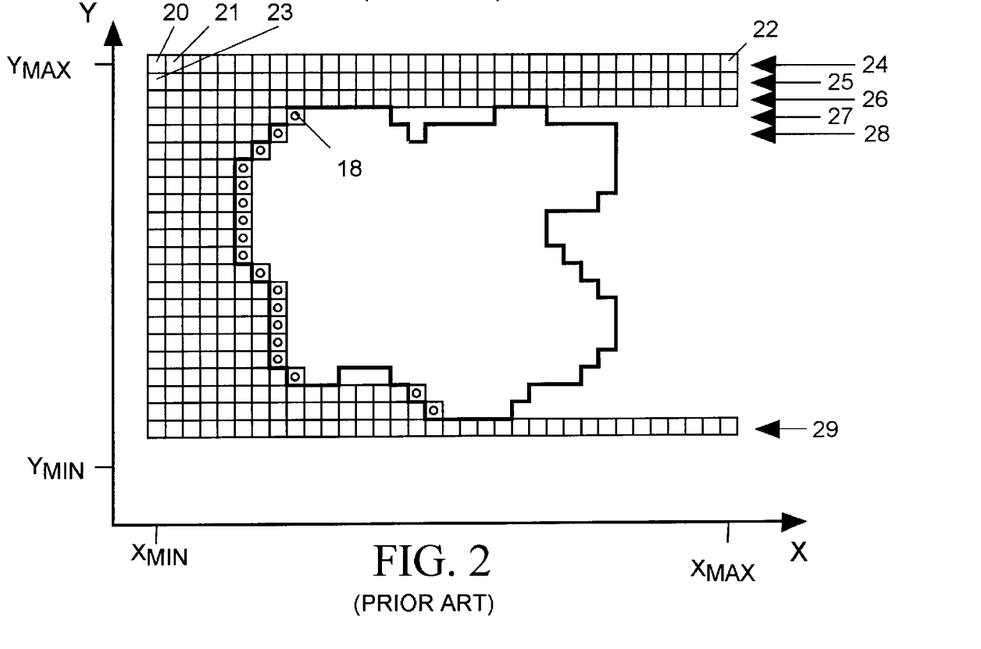
FIGS. 2–4 illustrate stages of development of a Shmoo contour plot created in accordance with a prior art method.
Figure 3:
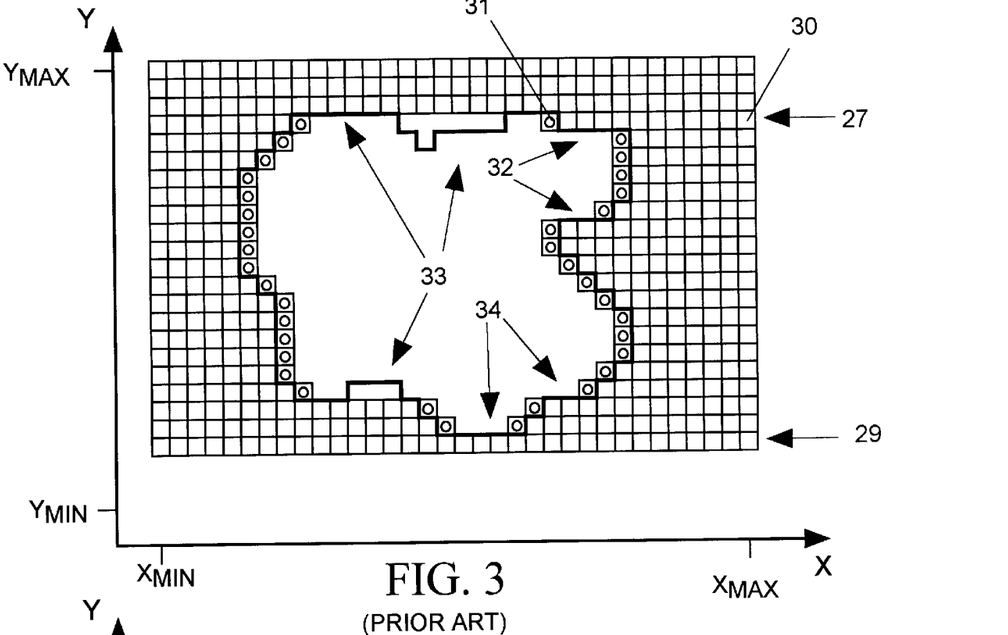

Though Shmoo plots are useful, they require a lot of tester time to produce the necessary data because the tester has to perform so many tests on the IC. However since ICs usually perform correctly at every point within the Shmoo plot's contour, a tester need not test every combination of parameters within the range of interest if it can perform enough tests to locate the Shmoo plot's contour, the boundary between areas of pass and fail. FIGS. 2 and 3 illustrate a method IC testers have commonly used to locate the boundaries of a Shmoo plot.

Referring to FIG. 2, the tester performs a first IC test to produce a pass/fail symbol at one corner of the area of interest bounded by $Y_{MAX}$, $Y_{MIN}$, $X_{MAX}$ and $X_{MIN}$. In the example of FIG. 2 the tester performs the first IC test with X and Y parameters set to $X_{MIN}$ and $Y_{MAX}$. Since the IC fails the test, the tester plots a fail symbol 20 at the appropriate plot coordinates. The tester then increments the X parameter and repeats the test. Since the IC again fails, the tester plots a fail symbol at the current X,Y coordinates, position 21. The tester continues to increment X and to test the IC and to plot fail symbols until X reaches $X_{MAX}$. at position 22. The tester then decrements Y, resets X to $X_{MIN}$, tests the IC and plots a fail symbol at position 23. The tester continues to test the IC for each successively lower value of Y at all values of X in the range of interest thereby producing complete rows of symbols 24–26 . However while traversing row 27, the tester encounters a combination of X and Y values on the Shmoo plot contour for which the IC passes the test. It then produces a "pass" symbol 18 at the current X,Y coordinates. At this point, since it has located a point on left side of the Shmoo plot contour, the tester stops traversing row 27, decrements Y, resets X to $X_{MIN}$ and begins producing symbols along the next row 28. The tester continues to repeat the process producing a row of symbols for each successively smaller value of Y with each row ending either at (Y,$X_{MAX}$) if the IC does not pass the test for any value of X along that row or at the first X position of the row for which the IC passes a test. The tester may halt the procedure when it first encounters a row 29 for which the IC once again fails at all X positions.

By this time the tester has discovered several points along the left side of the Shmoo plot contour of FIG. 1. As illustrated in FIG. 3, the tester looks for points along the right side of Shmoo plot contour by performing tests starting at the right side of the plot, for example at the rightmost point 30 of the uppermost row 27 not already fully tested and working its way leftward along the row until it reaches a point 31 on the Shmoo plot contour. The tester repeats this process for each lower row to locate points along the right side of the Shmoo plot contour. The tester stops testing when it reaches row 29 for which the IC fails at all points.

As may be seen in FIG. 3 the tester has not yet located every point of the actual Shmoo plot contour because it has not performed a test at every (X,Y) point along the contour. The contour is therefore indeterminate in certain areas, for example in areas 32–34. A tester could locate most of these areas of the Shmoo plot contour by performing two other sets of tests in which it moves along symbol columns toward the Shmoo contour starting both from above and below the contour. However since the additional tests add more time to the testing process, testers typically do not often perform those additional tests.

Figure 4:
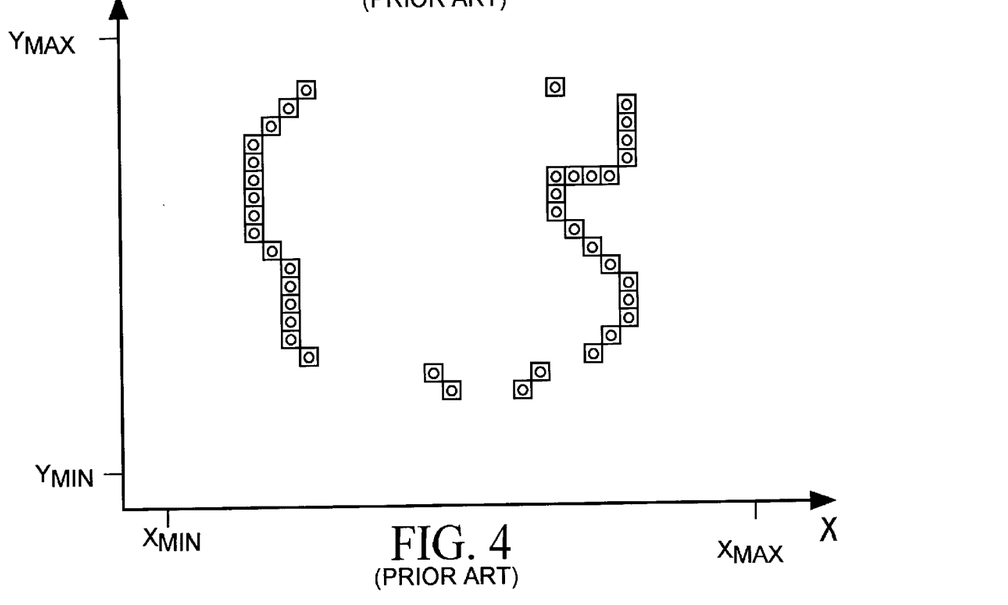

FIG. 4 illustrates a Shmoo contour plot that a tester might produce based on the pass/fail data of FIG. 3. Note that the Shmoo plot contour shown in FIG. 4 is not complete. Nonetheless the Shmoo contour plot of FIG. 4 is useful as a rough approximation of the true contour of the Shmoo plot of FIG. 1 and the tester performs only about half as many tests to produce the Shmoo contour plot of FIG. 4 than it would have to perform to produce the full Shmoo plot of FIG. 1. Note that most of the tests performed are "fails". Since an IC tester can quickly stop a test when the IC fails, most of the time-consuming "pass" tests are avoided by performing a contour test rather than a full Shmoo plot test. In any case, IC performance on and near the X,Y Shmoo plot contour is normally of primary interest because that's where the IC's problems normally lie.

It would be helpful, however, if a tester were able to locate a Shmoo plot contour by testing an IC at fewer combinations of X and Y parameter values and yet produce a more accurate depiction of the true Shmoo plot contour.

SUMMARY OF THE INVENTION

In accordance with the present invention, a test is repeatedly performed on an integrated circuit (IC) with the IC operating under each of several combinations of values of two IC operating parameters (X and Y) within a range of values of interest bounded by minimum and maximum values of X and Y: $X_{MIN}$, $Y_{MIN}$, $X_{MAX}$ and $Y_{MAX}$. The pass/fail results of the tests define a Shmoo plot contour representing the boundary of a two-dimensional range of combinations of values of the X and Y parameters for which the IC passes the test. In accordance with the invention, the tests are conducted in four phases.

During a first test phase, the combinations of values of the X and Y on the left side of the Shmoo plot contour (the side facing the −X direction) are located. The value of the X parameter is initially set to $X_{MIN}$ and the value of the Y parameter is initially set $Y_{MAX}$ and the integrated circuit device under test (DUT) is tested at those values of X and Y. If the DUT fails the test, the value of the X parameter is repeatedly incremented until the DUT passes the test. That combination of values of X and Y lies on the Shmoo plot contour. (If X reaches $X_{MAX}$ before the DUT passes the test, Y is decremented and the process of repeatedly incrementing X and testing the DUT is repeated until a passing X,Y combination is found.)

After the first passing combination of values of X and Y is found, Y is decremented while X is held at its current value. If the DUT initially passes the test for the lower value of Y, X is repeatedly decremented until a value of X is found for which the DUT fails the test (or until X reaches $X_{MIN}$), at which point Y is decremented. On the other hand if the DUT initially fails the test for a value of Y, X is repeatedly incremented until a value of X is found for which the DUT passes the test (or until X reaches $X_{MAX}$), at which point Y is decremented again. This process is repeated for each successively lower value of Y until Y reaches $Y_{MIN}$.

During a second test phase, combinations of values of X and Y on the side of the Shmoo plot contour facing right (the +X direction) are located. At the start of the second phase, the X parameter is initially set to $X_{MAX}$ and Y is initially set to $Y_{MAX}$. If the DUT then fails the test X is repeatedly decremented and the DUT retested until a value of X is found for which the DUT passes the test, at which point Y is decremented. If the DUT initially passes the test, X is repeatedly incremented until a value of X is found for which the DUT fails the test (or until X reaches $X_{MAX}$), at which point the value of Y is decremented. On the other hand, if the DUT initially fails the test for a value of Y, X is repeatedly decremented until a value of X is found for which the DUT passes the test (or X reaches $X_{MIN}$), at which point Y is decremented again. This process is repeated for each successively lower value of Y until Y reaches $Y_{MIN}$.

During a third test phase, combinations of values of X and Y on the side of the Shmoo plot contour facing upward (the +Y direction) are located. At the start of the third phase, the X parameter is initially set to $X_{MAX}$ and Y is initially set to $Y_{MAX}$. If the DUT then fails the test Y is repeatedly decremented and the DUT retested until a value of Y is found for which the DUT passes the test, at which point X is decremented. If the DUT initially passes the test, Y is repeatedly incremented until a value of Y is found for which the DUT fails the test (or until Y reaches $Y_{MAX}$), at which point the value of X is decremented. On the other hand, if the DUT initially fails the test for a value of X, Y is repeatedly decremented until a value of Y is found for which the DUT passes the test (or Y reaches $Y_{MIN}$), at which point X is decremented again. This process is repeated for each successively lower value of x until X reaches $X_{MIN}$.

During a fourth test phase, combinations of values of X and Y on the side of the Shmoo plot contour facing downward (the −Y direction) are located. At the start of the fourth phase, the X parameter is initially set to $X_{MIN}$ and Y is initially set to $Y_{MIN}$. If the DUT then fails the test Y is repeatedly incremented and the DUT retested until a value of Y is found for which the DUT passes the test, at which point X is incremented. If the DUT initially passes the test, Y is repeatedly decremented until a value of Y is found for which the DUT fails the test (or until Y reaches $Y_{MIN}$), at which point the value of X is incremented. On the other hand, if the DUT initially fails the test for a value of X, Y is repeatedly incremented until a value of Y is found for which the DUT passes the test (or Y reaches $Y_{MAX}$), at which point X is incremented. This process is repeated for each successively higher value of X until X reaches $X_{MAX}$.

It is accordingly an object of the invention to produce a Shmoo contour plot representing the boundary of a two-dimensional range of combinations of values of two operating parameters for which an IC passes a test.

It is another object of the invention to limit the number of times the IC must be tested in order to produce sufficient data create a Shmoo contour plot.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

DESCRIPTION OF THE PREFERRED EMBODIMENT(S)

Figure 5:
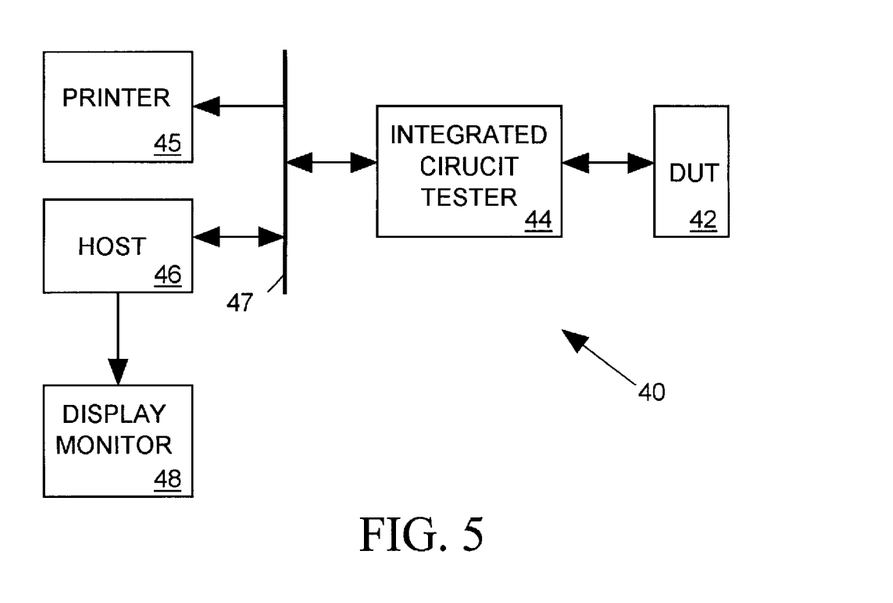
FIG. 5 illustrates in block diagram form an apparatus for generating a Shmoo contour plot in accordance with the present invention.

FIG. 5 illustrates an apparatus 40 in accordance with the present invention for producing a Shmoo plot contour graph indicating a range of values of a pair of operating parameters under which an integrated circuit device under test (DUT) 42 can pass a test. Apparatus 40 includes a conventional integrated circuit tester 44 controlled by a host computer 46 via programming data and control signals sent to tester 44 via a bus 47. The programming data tells tester 44 how to test DUT 42 and indicates how tester 44 is to set values of various DUT operating parameters for the test. Such operating parameters may include, for example, the power supply voltage provided to DUT 42, the level of load current DUT 42 is to drive at its output terminals, the frequency of a clock signal input to DUT 42, and the like. After carrying out the test indicated by its programming data, tester 44 transmits pass/fail data back to host computer 46 via bus 47 indicating whether DUT 42 passed or failed the test.

When host computer 46 tells tester 44 to repeatedly perform the same test on DUT 42 using different combinations of values of two operating parameters, host computer 46 can generate a Shmoo plot on display monitor 48 or paper printer by a printer 45. A "Shmoo plot", as illustrated, for example, in FIG. 1, graphically distinguishes the combinations of operating parameter values for which DUT 42 can operate correctly from the combinations of operating parameter values for which DUT 42 fails to operate correctly. The Shmoo plot has a horizontal X axis representing one of the operating parameters and a vertical Y axis representing the other operating parameter. (The "X" or "Y" parameter of a Shmoo plot may also be some mathematical combination of several operating parameters.) A color or other characteristic of a symbol appearing at each position of the Shmoo plot defined by coordinates X and Y indicates whether DUT 42 passed or failed a test conducted with operating parameter values indicated by the symbol's X and Y coordinates. In FIG. 1 each square containing a small circle represents a passed DUT test while each square not containing a small circle represents a failed DUT test.

Host computer 46 could acquire all data it needs to produce the full Shmoo plot of FIG. 1 by configuring tester 44 to test DUT 42 for every combination of X and Y operating parameters values within an area of interest bounded by minimum and maximum values of X and Y: $X_{MIN}$, $Y_{MIN}$, $X_{MAX}$ and $Y_{MAX}$. However tester 44 has to carry out a large number of tests in order to provide host computer 46 with enough data to produce a full Shmoo plot. Fortunately, however, since DUTs usually perform correctly at every point within a bounded area of a Shmoo plot, the DUT's behavior with respect to its X and Y operating parameters can be adequately represented by a plot of the Shmoo's contour. To produce a Shmoo contour plot it isn't necessary to test the DUT for every combination of X and Y parameters within the range of interest. In accordance with the invention, host computer 46 chooses successive combinations of x and Y parameter values for which DUT 42 is to be tested in a manner requiring tester 44 to perform only a relatively small number of DUT tests. The algorithm host computer 46 carries out to determine how to set the X and Y parameter values has four phases as described below. FIGS. 6–10 illustrate the progression of the Shmoo contour plot as the algorithm proceeds through the four phases. FIGS. 11–14 respectively illustrate the four phases of the Shmoo contour plotting algorithm in flow chart form.

Phase 1

Figure 6:
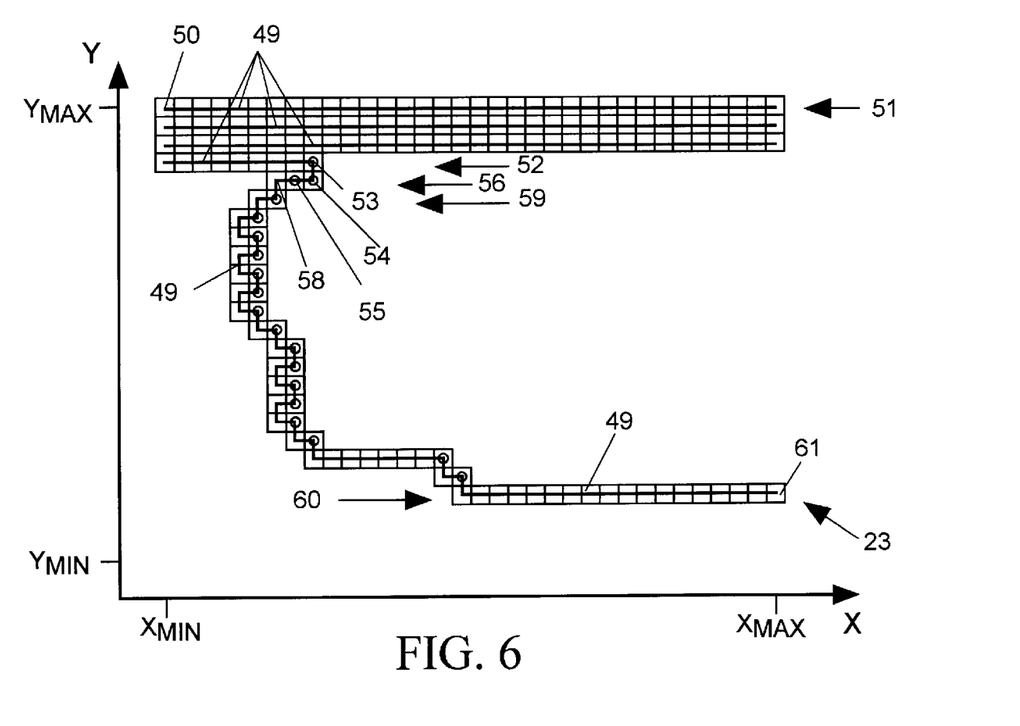
FIGS. 6–10 illustrate stages of development of a Shmoo contour plot created in accordance with the present invention.

FIG. 6 illustrates the portion of the Shmoo plot contour produced during the Phase 1 of the algorithm when looking for the contour of the Shmoo plot of FIG. 1. Each small square in FIG. 6 represents a test performed using the values of X and Y parameters indicated by the square's X and Y coordinates. A circle within a square indicates that the DUT passed a test using the value of X and Y parameters indicated by the square's coordinates. The order in which the algorithm directs computer 44 to plot the Shmoo contour is indicated by bold black lines 49 passing through the squares.

Figure 11:
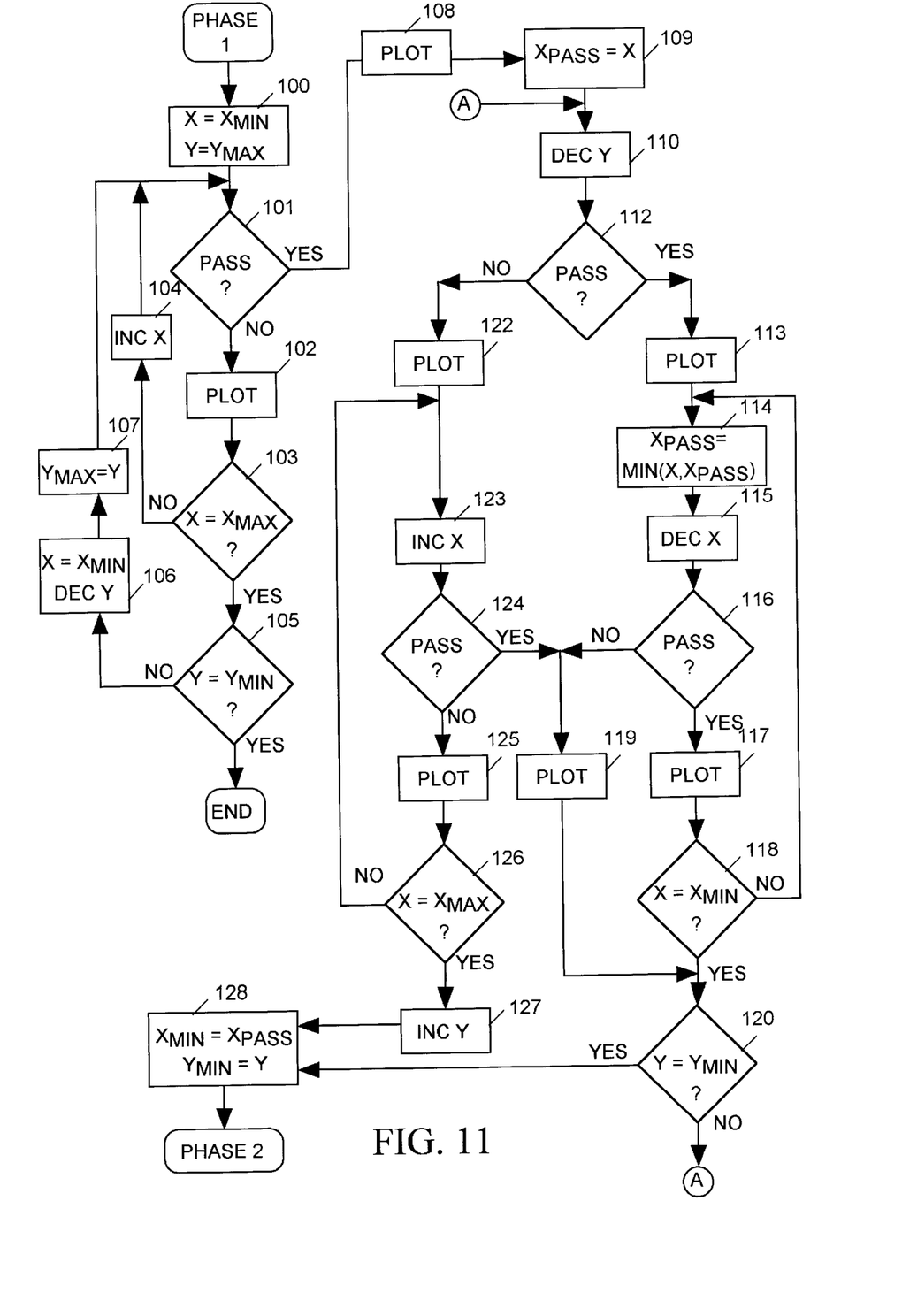
FIGS. 11–14 illustrate in flow chart diagram form steps carried out by the host computer of FIG. 5 in creating the Shmoo contour plot of FIGS. 6–10.

FIG. 11 illustrates Phase 1 of the algorithm. Referring to FIGS. 6 and 11, at the start of the Phase 1, host computer 46 initially commands tester 44 to set the value of Y to $Y_{MAX}$ and to set the value of X to $X_{MIN}$ (step 100) and then commands tester 44 to indicate if the DUT passes a test using those X and Y parameter values (step 101). If tester 44 reports that the DUT did not pass the test, host computer 46 plots a fail symbol 50 in the Shmoo contour plot at the intersection of $Y_{MAX}$ and $X_{MIN}$ (step 102).

Since X is not yet at its maximum level $X_{MAX}$ (step 103), host computer 46 increments X by a predetermined X step size (step 104) and returns to step 101 where it commands tester 44 to repeat the test for the new value of X. Host computer 46 continues to repeat steps 101–104 making a rightward (+X direction) traverse of row 51 of FIG. 6. Since X reaches $X_{MAX}$ at step 103 before the DUT passes a test, and since Y is not yet at its minimum value $Y_{MIN}$ (step 105), host computer 46 decrements Y and resets X to $X_{MIN}$ (step 106). Host computer 46 also sets $Y_{MAX}$ equal to Y since the DUT has failed for all values of Y above the current value of Y. Host computer 46 then returns to step 101 to begin a rightward traverse the next lower row. Host computer 46 continues to loop through steps 101–107 traversing each successively lower row rightward until in row 52 it finds a combination of X and Y parameter values for which the DUT passes the test (step 101). At the appropriate X,Y coordinate of row 52, host computer 46 plots a pass symbol 53 (step 108). Host computer 46 also sets the value of a $X_{PASS}$ variable to the current value of X (step 109). (During Phase 1, the $X_{PASS}$ variable is used to keep track of the smallest value of X for which the DUT passes the test.) Host computer 46 the decrements the value of Y by a predetermined step size (step 110) and commands tester 44 to test the DUT with the current values of X and Y (step 112). Since the DUT passes the test, host computer 46 plots a pass symbol 54 at the current X,Y coordinates of Shmoo plot row 56 (step 113), sets the value of the $X_{PASS}$ variable to the lesser of the current value of X and the current value of $X_{PASS}$ (step 114), decrements X (step 115) and commands tester 44 to perform the test (step 116). Since the DUT again passes the test, the host computer 46 plots a pass symbol at position 55 (step 117). Since the value of X has not reached $X_{MIN}$ (step 118), host computer 46 returns to step 114. Host computer 46 continues to loop through steps 114–118, thereby traversing row 56 of the Shmoo plot in the leftward (–X) direction until at step 116 the tester reports that the DUT has failed the test. Host computer 46 then plots a fail symbol 58 at the appropriate X,Y coordinates of the Shmoo plot (step 119).

After step 119, or after step 118 if X has reached $X_{NIN}$ at that point, host computer 46 determines whether Y has yet reached $Y_{MIN}$ (step 120). Since Y has not reached $Y_{MIN}$, host computer 46 returns to step 110 to decrement Y. After decrementing Y at step 110, if host computer 46 detects at step 112 that the DUT does not pass the test, host computer 46 plots a fail symbol at the current X,Y coordinates (step 122) and begins traversing the current row to the right looking for a DUT pass. To do so it increments X (step 123), tests the DUT (step 124), plots a fail symbol when the DUT fails (step 125) and reverts to step 123. Host computer 44 continues to loop through steps 123–126 traversing the Shmoo plot rightward plotting fail symbols until at step 124 the DUT passes the test. At that point host computer 44 plots a pass symbol at the current X,Y coordinates (step 119), and if Y is not yet equal to $Y_{MIN}$ (step 120), decrements Y (step 110) and begins traversing the next Shmoo plot row.

When at step 120, Y reaches $Y_{MIN}$, the plotting process has gone out of the range of interest. Host computer 46 therefore sets $X_{MIN}$ equal to $X_{PASS}$ and $Y_{MIN}$ equal to Y (step 128). Also if at step 126 X has reached $X_{MAX}$ on some row, then the plotting process has gone below the lowest (smallest Y) point of the Shmoo plot contour. In such case computer 44 increments Y (step 127) before it sets $Y_{MIN}$ equal to the current value of Y and sets $X_{MIN}$ equals to $X_{PASS}$ (step 128). After step 128, host computer 44 moves on to Phase 2 of the algorithm.

Phase 2

Figure 7:
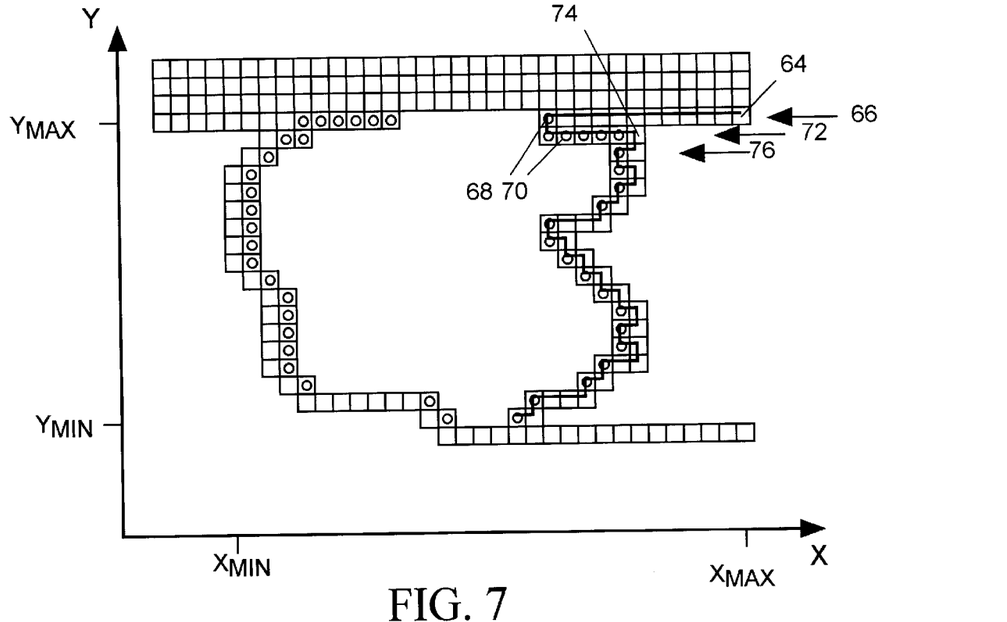
Figure 12:
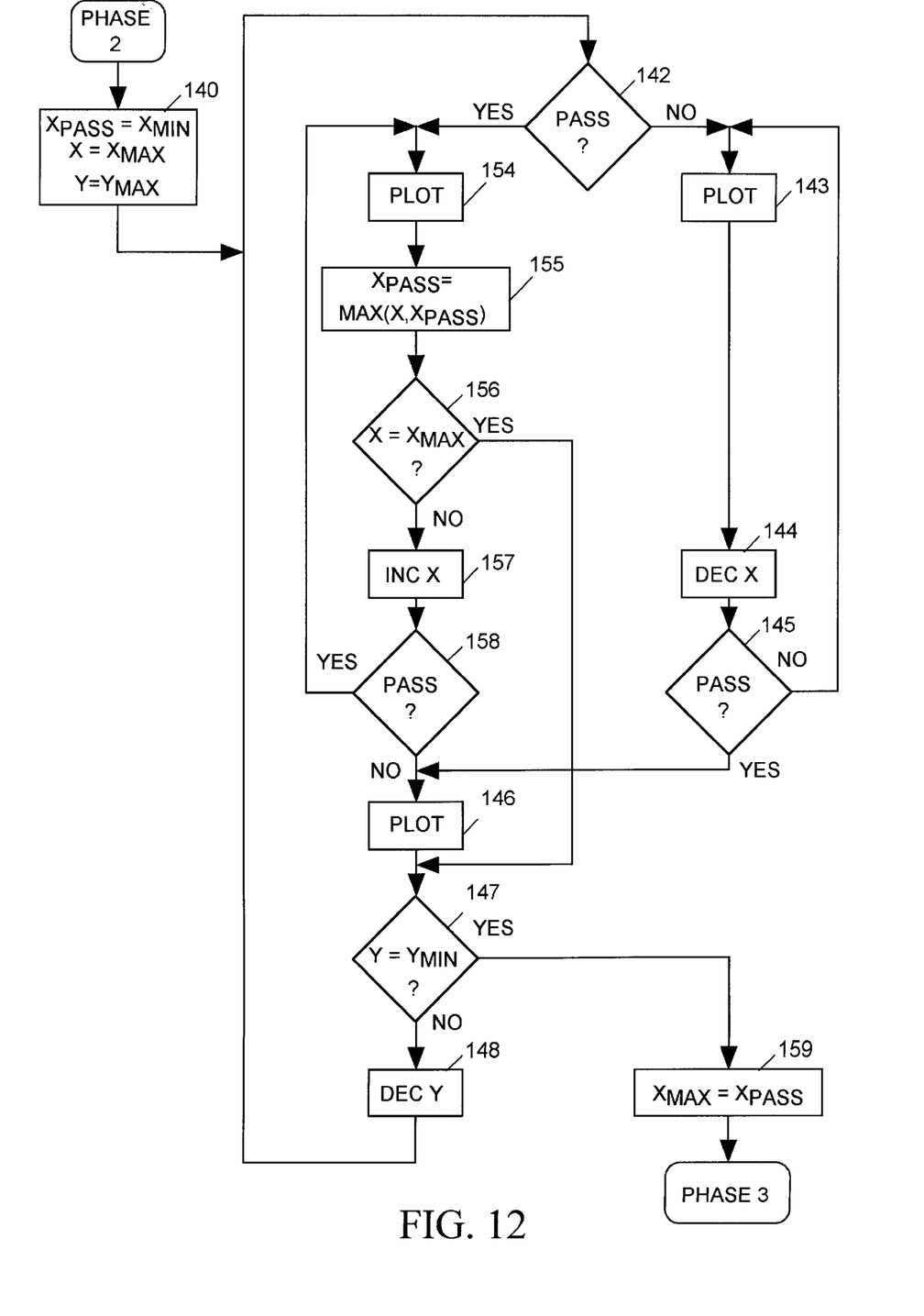

FIG. 7 illustrates how Phase 2 of the algorithm fills in additional portions of the Shmoo contour plot. FIG. 12 illustrates operation of host computer 46 during Phase 2 of the algorithm. Note that the $Y_{MIN}$ and $X_{MIN}$ values are higher at the start of Phase 2 than they were at the start of Phase 1 because they were raised at step 128 of the Phase 1 algorithm of FIG. 11. Also the value of $Y_{MAX}$ is lower at the start of Phase 2 than it was at the start of Phase 1 because it was reduced at step 107 of the Phase 1 algorithm of FIG. 11.

Referring to FIGS. 7 and 12, computer 46 first initializes $X_{PASS}$ variable to $X_{MIN}$, sets X equal to $X_{MAX}$, and sets Y equal to $Y_{MAX}$ (step 140). (During Phase 2, the $X_{PASS}$ variable is used to keep track of the maximum value of X for which the DUT passes the test.) The DUT is then tested (step 142) and since the DUT fails the test computer 46 plots a fail symbol 64 at the current X,Y position (step 143), decrements X (step 144), and repeats the test (step 145). Computer 46 continues to loop through steps 143–145 traversing row 66 of the Shmoo plot of FIG. 7 to the left (−X direction) plotting fail symbols until at step 145 tester 44 indicates that the DUT has passed the test. Computer 46 then plots a pass symbol 68 at the Shmoo plot position corresponding to the current X,Y values (step 146). Since Y is not yet equal to $Y_{MIN}$ (step 147), computer 44 decrements Y (step 148) and returns to step 142 to test the DUT. Since the DUT passes the test (step 142), computer 46 plots a pass symbol at position 70 (step 154), sets $X_{PASS}$ equal to the maximum of X and $X_{PASS}$ (step 155), increments X (step 157) and tests the DUT (step 158). Computer 46 continues to loop through steps 154–158 traversing row 72 of the Shmoo plot of FIG. 7 to the right plotting pass symbols until at step 158 tester 44 indicates that the DUT has failed the test. Computer 46 then plots a fail symbol 74 at the Shmoo plot position corresponding to the current X,Y values (step 146).

After step 158, or after step 156 if X had reached $X_{MAX}$ before the DUT failed the test, computer 46 compares the current value of Y to $Y_{MIN}$ (step 147). Since Y has not yet decreased to $Y_{MIN}$, computer 46 again decrements Y by the unit Y step size (step 148) and repeats steps 142–146, thereby traversing row 76 to the left plotting fail symbols and looking for a DUT pass. The Phase 2 process continues row by row until at step 147, Y reaches $Y_{MIN}$. At that point computer 46 sets $X_{MAX}$ equal to $X_{PASS}$ (step 159) and moves to Phase 3 of the process.

Phase 3

Figure 8:
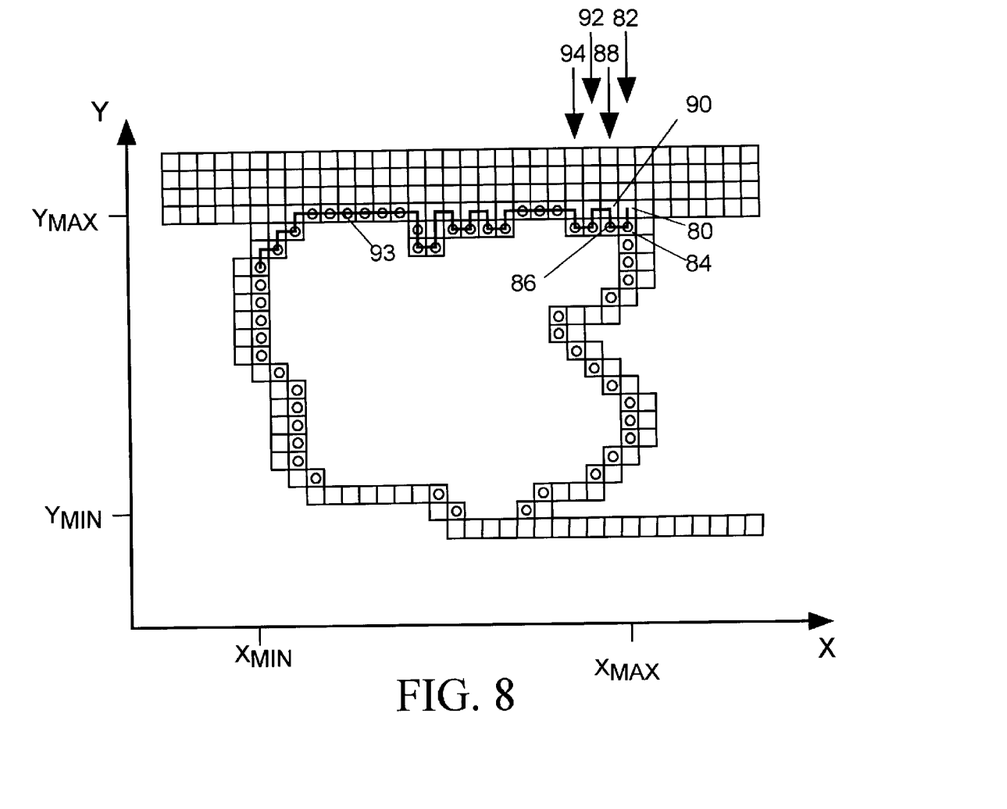

FIG. 8 illustrates how Phase 3 of the algorithm fills in additional portions of the Shmoo contour plot. Note that the $X_{MAX}$ value is lower at the start of Phase 3 than it was at the start of Phase 2 because it was lowered at step 159 of the Phase 2 algorithm of FIG. 12. This limits the range of X values of interest so as to reduce the number of tests that must be performed during Phases 3 and 4.

Figure 13:
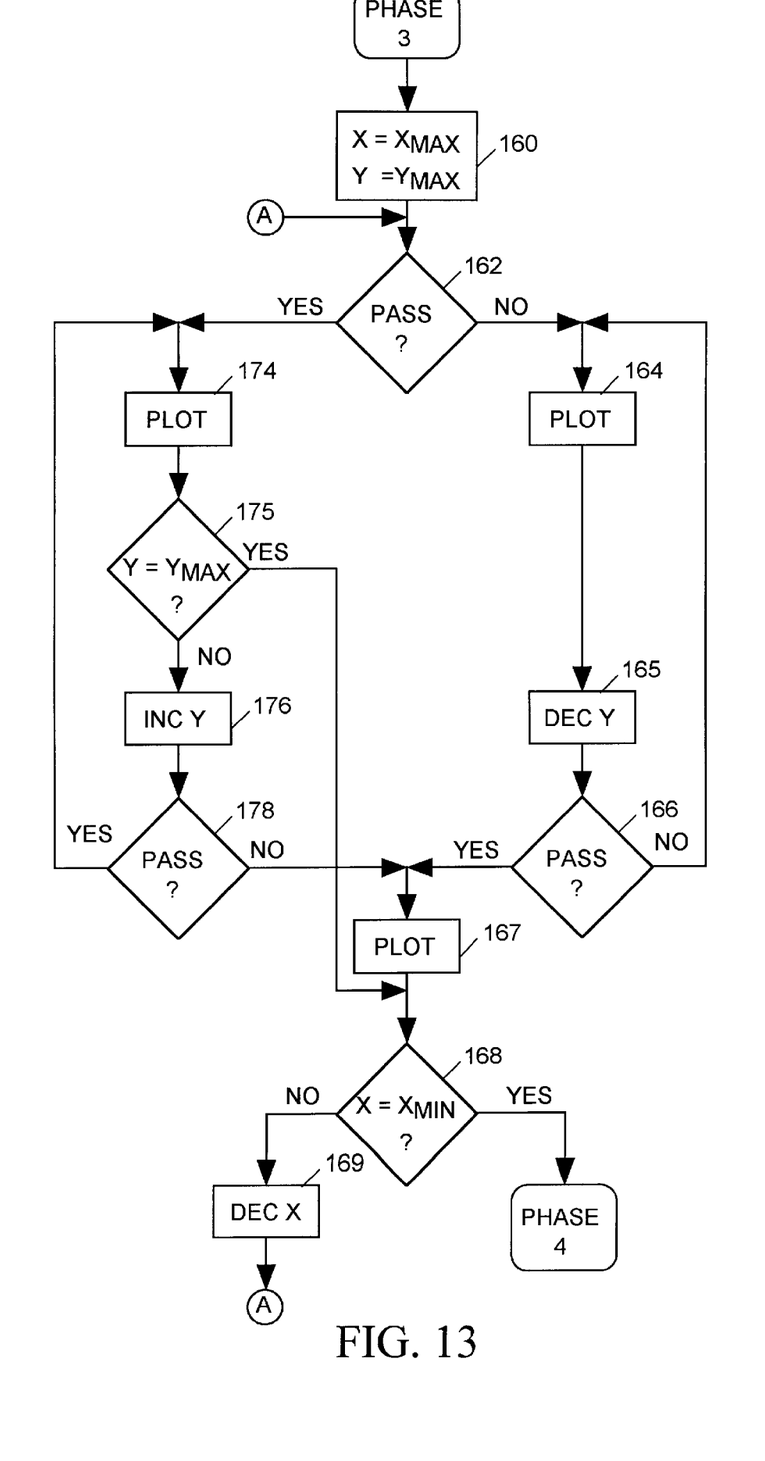

FIG. 13 is a flow chart illustrating operation of host computer 46 during Phase 3 of the algorithm. Referring to FIGS. 8 and 13, computer 46 first sets X equal to $X_{MAX}$ and Y equal to $Y_{MAX}$ (step 160) and then signals tester 44 to test the DUT (step 162). Since the DUT fails the test at ($X_{MAX}$, $Y_{MAX}$), computer 46 plots a fail symbol 80 at that X,Y position (step L64), decrements Y (step 165), and repeats the test (step 166). Computer 46 continues to loop through steps 164–166 traversing downward (−Y direction) along column 82 of the Shmoo plot of FIG. 8 until at step 166 tester 44 indicates that the DUT has passed the test. Computer 46 then plots a pass symbol 84 at the Shmoo plot position corresponding to the current X,Y values (step 167). If X is not yet equal to $X_{MIN}$ (step 168), computer 46 decrements X (step 169) and returns to step 162 to test the DUT. Since the DUT passes the test (step 162) computer 46 plots a pass symbol 86 at the current X,Y position (step 174). Since Y has not yet reached $Y_{MAX}$ (step 175), computer 46 increments Y (step 176) and tests the DUT (step 178). Computer 46 continues to loop through steps 174–178 traversing column 88 upward (+Y direction) until at step 178 tester 44 indicates the DUT has failed the test. Computer 46 then plots a fail symbol 90 at the current X,Y position (step 167). After step 167, or after step 175 if Y reaches $Y_{MAX}$ before the DUT fails a test, computer 46 compares the current value of X to $X_{MIN}$ (step 168). Since X has not yet decreased to $X_{MIN}$, computer 46 decrements X (step 169) and loops through steps 162–166, traversing column 92 downward (−Y direction) looking for a DUT pass. The process continues column by column following path 93 along the Shmoo plot until X reaches $X_{MIN}$ at step 168. At that point computer 46 moves to Phase 4 of the process.

Phase 4

Figure 9:
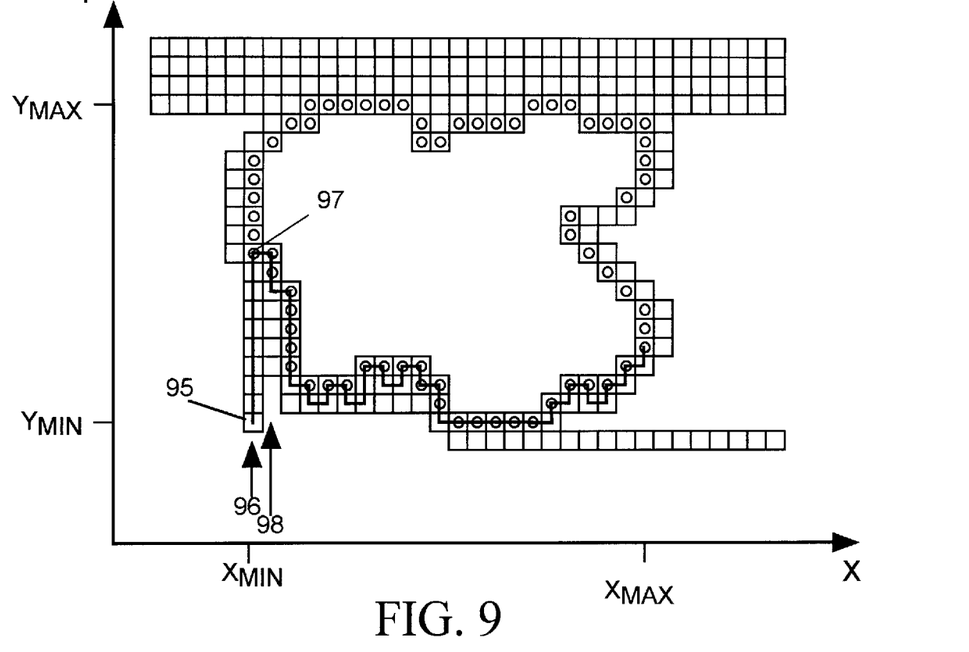
Figure 14:
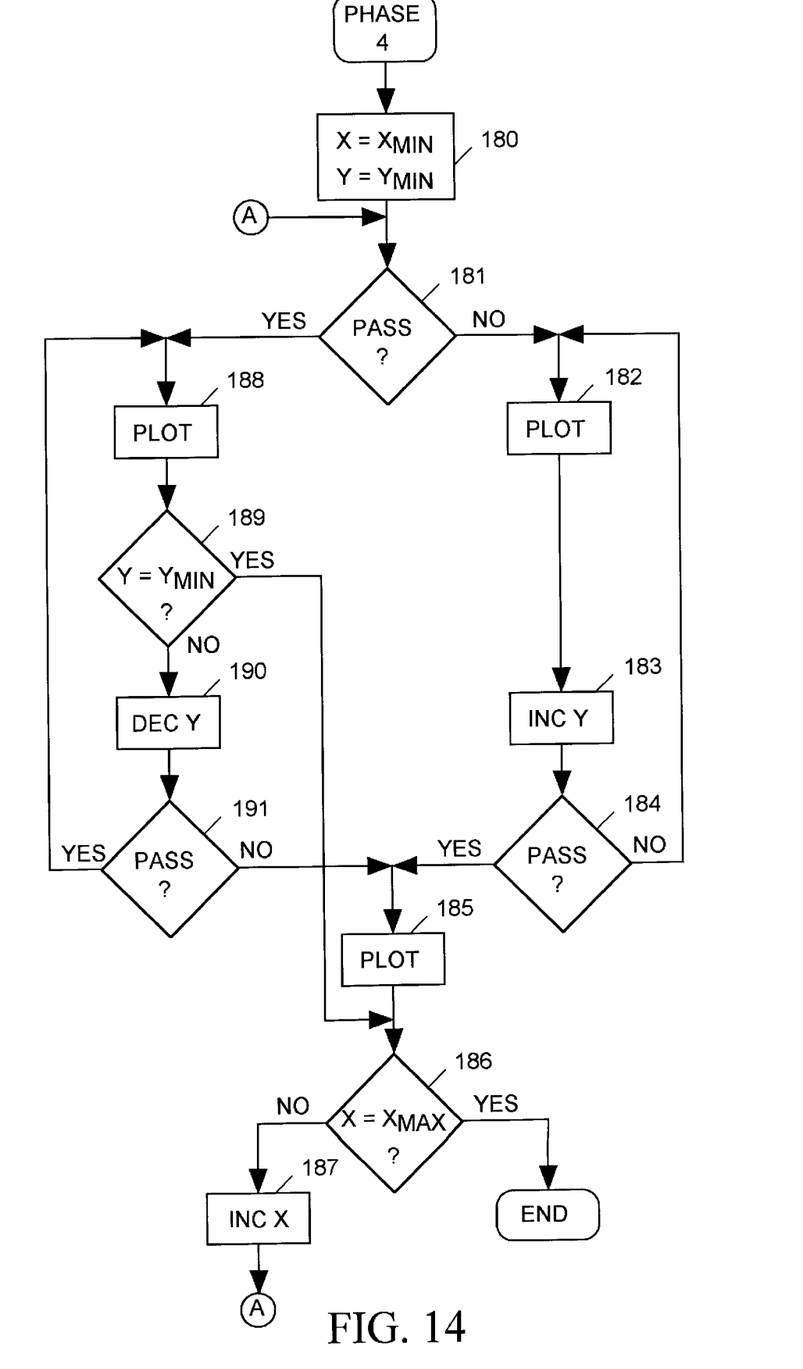

FIG. 9 illustrates how Phase 4 of the algorithm fills in remaining portions of the Shmoo contour plot. FIG. 14 is a flow chart illustrating operation of host computer 46 during Phase 4 of the algorithm. Referring to FIGS. 9 and 14, computer 46 first sets X equal to $X_{MIN}$ and Y equal to $Y_{MIN}$ (step 180), and then signals tester 44 to test the DUT (step 181). Since the DUT fails the test at ($X_{MIN}$, $Y_{MIN}$), computer 46 plots a fail symbol 95 at the current X,Y position (step 182), increments Y (step 183), and repeats the test (step 184). Computer 46 continues to loop through steps 182–184 traversing upward (+Y direction) along column 96 of the Shmoo plot of FIG. 9 until at step 184 tester 44 indicates that the DUT has passed the test. Computer 46 then plots a pass symbol at the Shmoo plot position 97 corresponding to the current X,Y values (step 185). Since X is not yet equal to $X_{MAX}$ (step 186), computer 46 increments X (step 187) and signals tester 44 to test the DUT (step 181). Since the DUT passes the test computer 46 plots a pass symbol at the appropriate position on column 98 (step 188). Since Y has not yet reached $Y_{MIN}$ (step 189), computer 46 decrements Y (step 190) and tests the DUT (step 191). Computer 46 continues to loop through steps 188–191 traversing column 98 downward (−Y direction) until at step 191 tester 44 indicates the DUT has failed the test. Computer 46 then plots a fail symbol at the Shmoo plot position corresponding to the current X,Y values (step 185). After step 185, or after step 189 if Y reaches $Y_{MIN}$ before the DUT failed the test, computer 46 compares the current value of X to $X_{MAX}$ (step 186). Since X has not yet increased to $X_{MAX}$, computer 46 increments X (step 187) and returns to step 181. Phase 4 of the process continues column by column until at step 186, X reaches $X_{MAX}$. At that point computer 46 terminates the Shmoo plot contour algorithm.

Figure 10:
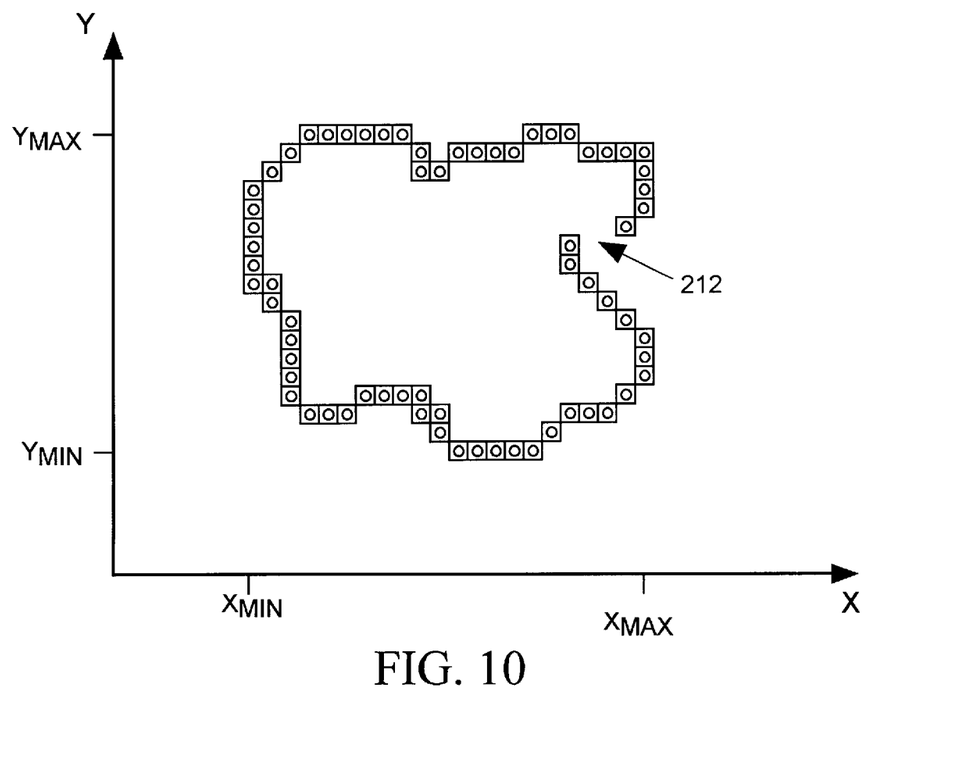

FIG. 10 illustrates the Shmoo contour plot computer 44 produces on printer 45 or display monitor 48 of FIG. 5 after carrying out the above described method. Note that the Shmoo plot contour of FIG. 10 produced in accordance with the present invention is much more complete than the Shmoo contour plot of FIG. 4 produced in accordance with the prior art method. Note also, by comparing FIG. 3 with FIG. 9, that the prior art contour plotting method requires a tester to perform many more tests than the contour plotting method of the present invention.

Alternative Embodiment

Figure 15:
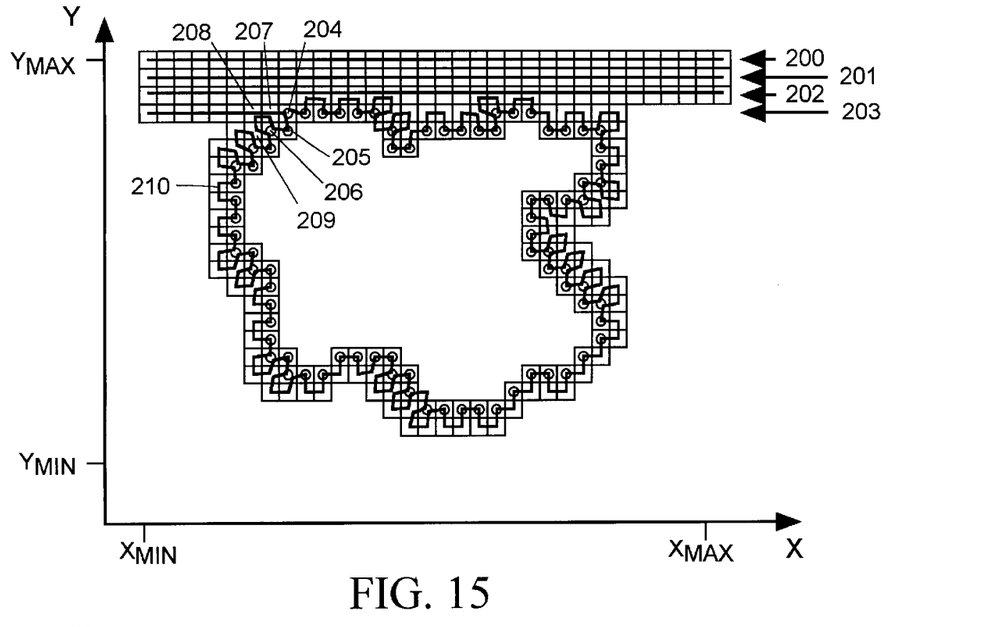
FIGS. 15 and 16 illustrate stages of development of a Shmoo contour plot created in accordance with an alternative embodiment of the present invention.
Figure 16:
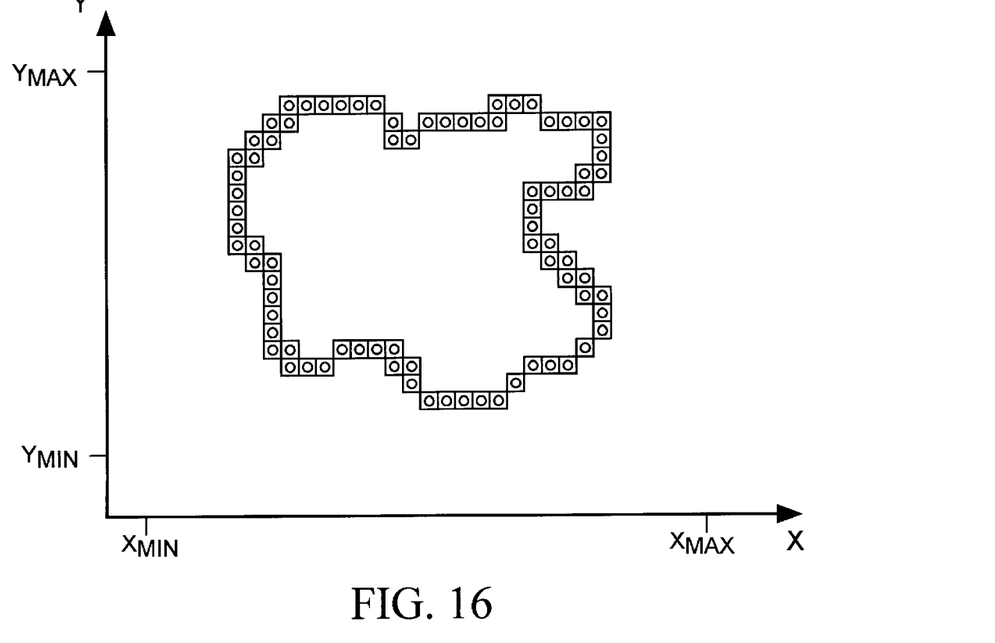
Figure 17:
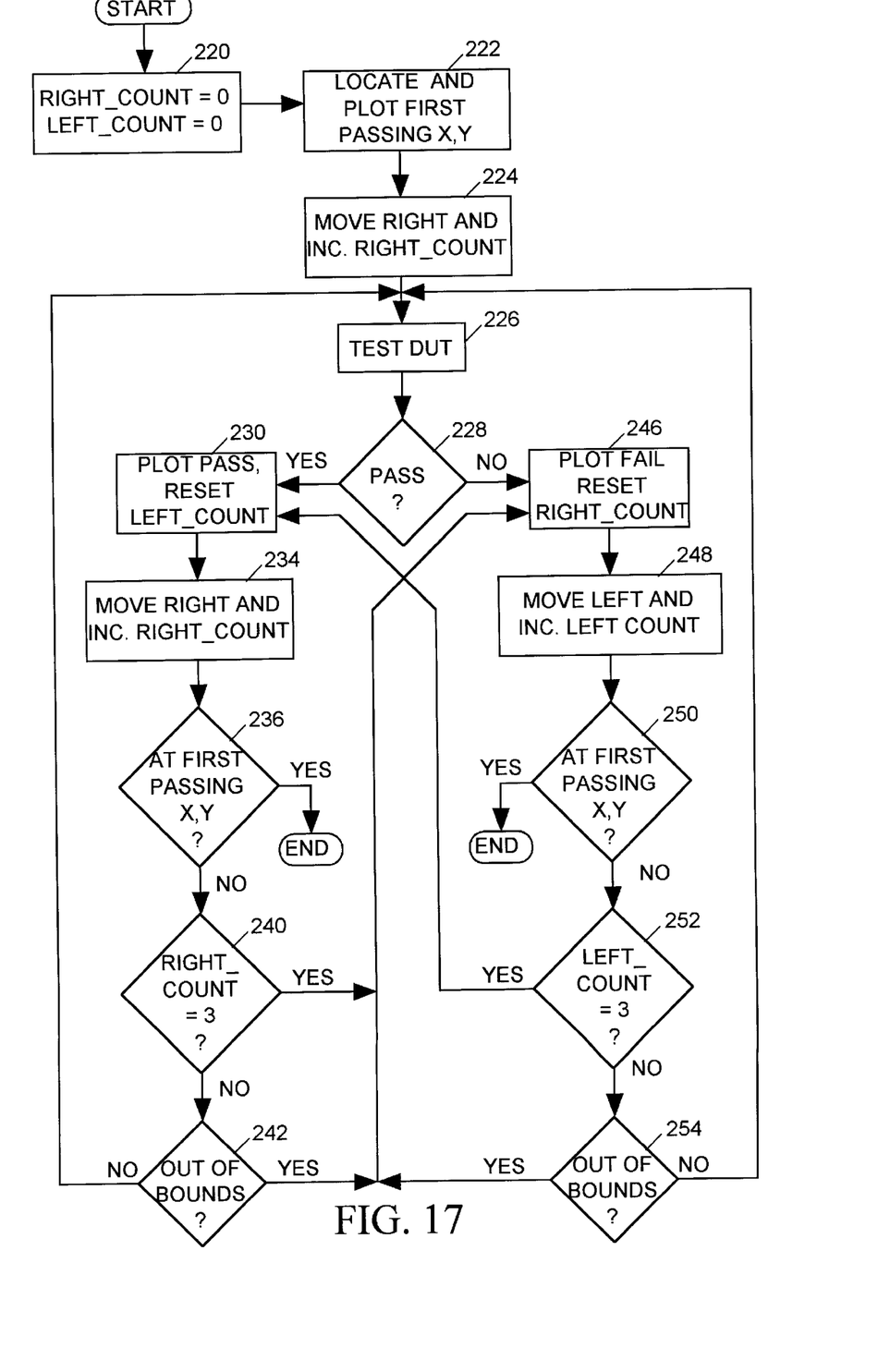
FIG. 17 illustrates in flow chart diagram form steps carried out by the host computer of FIG. 5 in creating the Shmoo contour plot of FIGS. 15 and 16.

FIGS. 15 and 16 illustrate development of a Shmoo contour plot created in accordance with an alternative embodiment of the present invention. FIG. 17 illustrates in flow chart diagram form the steps carried out by host computer 46 of FIG. 5 in creating the Shmoo contour plot of FIGS. 15 and 16.

Referring to FIGS. 15–17, host computer 5 initially (step 220 of FIG. 17) sets a pair of variables RIGHT_COUNT and LEFT_COUNT to 0. Computer 46 then locates and plots (step 222) a first combination of X and Y values for which the DUT passes the test using the algorithm indicated in steps 100–108 of FIG. 11. Thus Computer 46 scans rows 200–203 plotting DUT test fails until it finds an X,Y coordinate for which the DUT passes a test. At that point it plots a pass symbol at the current X,Y coordinate 204. The flow chart of FIG. 17 assumes a "direction" of movement as computer 46 moves from coordinate to coordinate.

Hence forward, computer 46 "moves" from X,Y coordinate to coordinate testing the DUT at each coordinate is passes through. To move from one X,Y coordinate to the next, computer 46 may only move either horizontally or vertically by 1 unit X or Y step and may not move diagonally. In particular, if we consider the computer 46 as having a "direction" of movement as it enters any particular X,Y coordinate, then it follows two rules in choosing the next coordinate:

1. if computer 46 moves into a X,Y coordinate for which the DUT passes the test, then it moves to the next X,Y coordinate to the right relative to its last direction of movement, and 2. if computer 46 moves into an X,Y coordinate for which the DUT fails the test or for which the X,Y coordinate is out of the bounds defined by $X_{MAX}$, $X_{MIN}$, $Y_{MAX}$, and $Y_{MIN}$, then it moves to the next X,Y coordinate to the left relative to its last direction of movement.

When computer 46 moved to X,Y coordinates 204, its direction of movement was in the +X direction. Thus after detecting that the DUT passed the test at coordinate 204 (step 222), computer 46 moves to the next coordinate 205 the "right" relative to the +X direction of movement by decrementing Y (step 224). Computer 46 also increments the RIGHT_COUNT parameter at step 224.

Computer 46 then tests the DUT at coordinate 205 (step 226) and since the DUT passes the test, it plots a pass symbol at the new X,Y coordinates (step 230). (If the LEFT_COUNT parameter is not already 0 at step 230, computer 46 resets it to 0.) Since the DUT passes at coordinate 205, computer 46 moves to the right once again to coordinate 206 and increments the RIGHT_COUNT parameter once again (step 234). Since it has not yet returned to the first passing X,Y coordinate 204 (step 236), since the RIGHT_COUNT parameter has not yet reached 3 (step 240), and since the current X,Y coordinates are not out of bounds (step 242) computer 46 returns to step 226 to retest the DUT. Since the DUT passes the test at current coordinates 206 (step 228), computer 46 plots the pass symbol at coordinate 206 and then moves to the right and increments the RIGHT_COUNT parameter (step 234). After determining that it has not returned to coordinate 204, computer 46 finds that the RIGHT_COUNT parameter has reached 3. This means that it has moved to an X,Y coordinate 207 for which the DUT has already been tested and failed. At this point, computer 46 moves to step 246 where it plots a fail symbol and resets the RIGHT_COUNT parameter to 0. It then moves left to X,Y coordinate 208 and increments the LEFT_COUNT parameter (step 248). Since computer 46 has not returned to the first passing X,Y coordinate 204 (step 250), since LEFT_COUNT has not reached 3 (step 252) and since the current X,Y coordinate 208 is not out of bounds (step 254), computer 46 tests the DUT at coordinate 208 (step 226). Since the test fails at coordinate 208, it plots the fail (step 246), moves left to coordinate 209 and increments the LEFT_COUNT parameter (step 248) and returns to step 226 via steps 252 and 254 to retest the DUT at coordinate 209. After plotting a fail symbol (step 246) and moving left (step 248) computer 46 finds at step 250 that it has moved left three times in a row and has returned to a coordinate 206 for which the DUT has already been tested and has passed. At that point program flow switches to step 230 where a pass symbol is plotted and the LEFT_COUNT parameter is reset to zero. As computer 46 progresses from coordinate-to-coordinate, it moves around the Shmoo contour in the manner indicated by the bold black line 210 until at step 236 it finds that it has returned to the first passing X,Y coordinate 204. At that point the Shmoo plot contour routine of FIG. 17 ends. FIG. 16 illustrates the resulting Shmoo plot contour.

In the example of FIG. 15, since all coordinates tested were within the boundaries defined by $X_{MAX}$, $X_{MIN}$, $Y_{MAX}$, and $Y_{MIN}$, the result of step 242 or 254 was always a "NO". However if computer 46 has moved to an X,Y coordinate that had been out of bounds, it would have treated that X,Y coordinate as a "fail" by moving to step 246.

The alternative embodiment of the Shmoo plot contour method illustrated in FIG. 17 can require tester 40 to conduct more tests on the DUT than the embodiment of the Shmoo plot contour method illustrated in FIGS. 11–14 but under some circumstances can provide a more complete picture of the Shmoo plot contour. Note that the Shmoo plot contour of FIG. 16 is substantially similar to the Shmoo plot contour of FIG. 10 except that a small gap 212 in the Shmoo plot contour of FIG. 10 does not appear in the Shmoo plot contour of FIG. 17. While Phases 1–4 of the method illustrated in FIGS. 11–14 locate the points along the Shmoo plot facing the −X, +X, +Y and −Y directions, respectively, those skilled in the art will appreciate that the method can be easily modified to locate points along the Shmoo plot contour faces in any order.

Those skilled in the art will appreciate that the algorithm for each phase could be modified so that the computer traverses a face in a direction opposite to that illustrated. For example the Phase 2 flow chart of FIG. 12 starts the process at $X_{MAX}$, $Y_{MAX}$ and works its way down the +X face of the Shmoo contour plot in the −Y direction, the Phase 2 process could also have started at $X_{MAX}$, $Y_{MIN}$ and worked its way up the +X face of the Shmoo contour plot in the +Y direction.

With regard to the alternative embodiment illustrated in FIG. 17, those skilled in the art will appreciate that the method could be easily modified to allow host computer to circumnavigate the Shmoo contour in a generally clockwise manner instead of the illustrated counter-clockwise manner by turning "left" on passes and "right" on fails.

While the present invention locates the contour of a Shmoo plot having two axes (X,Y), the invention could be employed to locate the contour of a Shmoo plot having three or more axes when three or more variable test parameters are of interest. For example, a three-axis (X,Y,Z) Shmoo plot contour would appear as a solid surface. The present invention could be used to quickly locate the contour of a three-dimensional Shmoo plot by locating the two-dimensional (X,Y) contour of a Shmoo plot for each value of interest of Z. By extention, the contour of an N− dimensional Shmoo plot may be located by locating the contour of an N−1 dimensional Shmoo plot for each value of the parameter corresponding to the Nth dimension.

Thus while the forgoing specification has described preferred embodiment(s) of the present invention, one skilled in the art may make many modifications to the preferred embodiment without departing from the invention in its broader aspects. For example, The appended claims therefore are intended to cover all such modifications as fall within the true scope and spirit of the invention.

What is claimed is:

1. A method of testing an integrated circuit (IC) with respect to various combinations of values of a first variable IC operating parameter (X) and a second variable IC operating parameter (Y) to rapidly determine a boundary of a two-dimensional range of combinations of values of the X and Y parameters for which the IC operates properly, the method comprising the steps of:

a. setting a first combination of values of said X and Y parameters;
   b. performing a test of said IC operating under said first combination of values of said X and Y parameters;
   c. if said IC fails the test performed at step b, repeatedly altering the value of the X parameter monotonically in a first direction to provide a first succession of combinations of values of said X and Y parameters and performing the test on the IC operating under each combination of said first succession until said IC passes said test;
   d. if said IC passes the test performed at step b, repeatedly altering the value of the X parameter monotonically in a second direction opposite of said first direction to form a second succession of combinations of values of said X and Y parameters, and performing the test on the IC operating under each combination of said second succession until said IC fails said test
   e. altering the value of said Y parameter, and repeating steps b through d, and
   f. performing a plurality of repetitions of step e with the value of the Y parameter being monotonically altered during each repetition of step e.

2. The method in accordance with claim 1 further comprising the steps of:

g. setting a second combination of values of said X and Y parameters;
   h. performing a teat of said IC operating under said second combination of values of said X and Y parameters;
   i. if said IC fails the test performed at step h, repeatedly altering the value of the X parameter monotonically in said second direction to provide a third succession of combinations of values of said X and Y parameters and performing the test on the IC operating under each combination of said third succession until said IC passes said test;
   j. if said IC passes the test performed at step h, repeatedly altering the value of the X parameter monotonically in a first direction to form a fourth succession of combinations of values of said X and Y parameters, and performing the test on the IC operating under each combination of said fourth succession until said IC fails said test.

3. The method in accordance with claim 2 comprising the further steps of:

k. altering the value of said Y parameter, and
   l. repeating steps h through j.

4. The method in accordance with claim 3 comprising the additional step of performing a plurality of repetitions of steps k and l with the value of the Y parameter being monotonically altered during each repetition of step k.

5. The method in accordance with claim 4 further comprising the steps of:

m. setting a third combination of values of said X and Y parameters;
   n. performing a test of said IC operating under said third combination of values of said X and Y parameters;
   o. if said IC fails the test performed at step n, repeatedly altering the value of the Y parameter monotonically in a third direction to provide a fifth succession of combinations of values of said X and Y parameters and performing the test on the IC operating under each combination of said fifth succession until said IC passes said test;
   p. if said IC passes the test performed at step n, repeatedly altering the value of the Y parameter monotonically in a fourth direction opposite of said fifth direction to form a sixth succession of combinations of values of said X and Y parameters, and performing the test on the IC operating under each combination of said sixth succession until said IC fails said test.

6. The method in accordance with claim 5 comprising the further steps of:

q. altering the value of said X parameter, and
   r. repeating steps n through p.

7. The method in accordance with claim 6 comprising the additional step of performing a plurality of repetitions of steps q and r with the value of the X parameter being monotonically altered during each repetition of step q.

8. The method in accordance with claim 7 further comprising the steps of:

s. setting a fourth combination of values of said X and Y parameters;
   t. performing a test of said IC operating under said fourth combination of values of said X and Y parameters;
   u. if said IC fails the test performed at step t, repeatedly altering the value of the Y parameter monotonically in said fourth direction to provide a seventh succession of combinations of values of said X and Y parameters and performing the test on the IC operating under each combination of said seventh succession until said IC passes said test;
   v. if said IC passes the test performed at step t, repeatedly altering the value of the Y parameter monotonically in said third direction to form an eighth succession of combinations of values of said X and Y parameters, and performing the test on the IC operating under each combination of said eighth succession until said IC fails said test.

9. The method in accordance with claim 8 comprising the further steps of:

w. altering the value of said X parameter, and
   x. repeating steps t through v.

10. The method in accordance with claim 9 comprising the additional step of performing a plurality of repetitions of steps w and x with the value of the X parameter being monotonically altered during each repetition of step w.

11. The method in accordance with claim 1 further comprising the step of generating a graph having a horizontal coordinate representing X parameter values and a vertical coordinate representing Y parameter values and displaying a symbol at an X,Y coordinate of said graph corresponding to each combination of X and Y parameter values for which said IC passes said test conducted while said IC is operating on said combination of X and Y parameter values.

12. The method in accordance with claim 10 further comprising the step of generating a graph having a horizontal coordinate representing X parameter values and a vertical coordinate representing Y parameter values and displaying a symbol at an X,Y coordinate of said graph corresponding to each combination of X and Y parameter values for which said IC passes said test conducted while said IC is operating on said combination of X and Y parameter values.

13. An apparatus for testing an integrated circuit (IC) with respect to various combinations of values of a first variable IC operating parameter (X) and a second variable IC operating parameter (Y) to rapidly determine a boundary of a two-dimensional range of combinations of values of the X and Y parameters for which the IC operates properly, the apparatus comprising:

tester means responsive to input control data indicating a combination of values of said X and Y parameter for performing a test on said IC operating on said combination of values and for producing output data indicating whether said IC passes said test; and control means for generating and transmitting said input control data to said tester means, said input control data indicating a first combination of values of said X and Y parameters such that said tester means performs said test of said IC operating under said first combination of values of said X and Y parameters, for receiving the output data produced by said tester means, and it said output data indicates said IC fails the test of said IC operating under said first combination of values of said X and Y parameters, for repeatedly generating and transmitting input altering the value of the X parameter monotonically in a first direction to provide a first succession of combinations of values of said X and Y parameters so that said tester means repeatedly performs the test on the IC operating under each combination of said first succession until said output data produced by said tester means indicates said IC passes said test, and if said output data indicates said IC passes the test of said IC operating under said first combination of values of said X and Y parameters, repeatedly altering the value of the X parameter monotonically in a second direction opposite of said first direction to form a second succession of combinations of values of said X and Y parameters, so that said tester performs the test on the IC operating under each combination of said second succession until said output data produced by said tester means indicates said IC fails said test, and for then monotonically altering the value of said Y parameter such that said tester means performs another test of said IC operation under a next combination of values of said X and Y parameters.

14. The apparatus in accordance with claim 13 further comprising means for generating a graph having a horizontal coordinate representing X parameter values and a vertical coordinate representing Y parameter values and displaying a symbol at an X,Y coordinate of said graph corresponding to each combination of X and Y parameter values for which said output data of said tester means indicates said IC passed said test while operating on said combination of X and Y parameter values.

15. A method of testing an integrated circuit (IC) with respect to various combinations of values of a first variable IC operating parameter (X) and a second variable IC operating parameter (Y) to rapidly determine a boundary of a two-dimensional range of combinations of values of the X and Y parameters for which the IC operates properly after having located a combination of X and Y parameter values on said boundary, the method comprising the steps of:

a. altering said Y parameter by a Y step amount to produce a current combination of X and Y parameter values, b. performing a test of said IC operating under said current combination of X and Y parameter values;

c. if the current combination of X and Y parameter values for which the IC was last tested at step b was produced by increasing said Y parameter value, and the IC passed the test last performed at step b, then decreasing the X parameter value to produce a new current combination of X and Y parameter values, d. if the current combination of X and Y parameter values for which the IC was last tested at step b was produced by decreasing the Y parameter value, and the IC passed the test last performed at step b, then increasing the X parameter value in a fourth direction opposite to said third direction to produce a new current combination of X and Y parameter values, e. if the current combination of X and Y parameter values for which the IC was last tested at step b was produced by decreasing the X parameter value, and the IC passed the test last performed at step b, then increasing the Y parameter value to produce a new current combination of X and Y parameter values and returning to step b, f. if the current combination of X and Y parameter values for which the IC was last tested at step b was produced by increasing the X parameter value, and the IC passed the test last performed at step b, then decreasing the X parameter value to produce a new current combination of X and Y parameter values and returning to step b, g. if the current combination of X and Y parameter values for which the IC was last tested at step b was produced by decreasing the Y parameter value, and the IC failed the test last performed at step b, then increasing the X parameter value to produce a new current combination of X and Y parameter values and returning to step b, h. if the current combination of X and Y parameter values for which the IC was last tested at step b was produced by increasing the Y parameter value, and the IC failed the test last performed at step b, then decreasing the X parameter value to produce a new current combination of X and Y parameter values and returning to step b, i. if the current combination of X and Y parameter values for which the IC was last tested at step b was produced by decreasing the X parameter value, and the IC failed the test last performed at step b, then decreasing the Y parameter value to produce a new current combination of X and Y parameter values and returning to step b, j. if the current combination of X and Y parameter values for which the IC was last tested at step b was produced by increasing the X parameter value, and the IC failed the test last performed at step b, then increasing the X parameter value to produce a new current combination of X and Y parameter values and returning to step b.

16. The method in accordance with claim 15 further comprising the step of:

k. repeating steps b–j until producing at one of steps c–j a current combination of X and Y parameter values matching the combination of X and Y parameter values produced at step a.

17. A method of testing an integrated circuit (IC) with respect to various combinations of values of a first variable IC operating parameter (X) and a second variable IC operating parameter (Y) to rapidly determine a boundary of a two-dimensional range of combinations of values of the X and Y parameters for which the IC operates properly after having located a combination of X and Y parameter values on said boundary, the method comprising the steps of:

a. altering said Y parameter by a Y step amount to produce a current combination of X and Y parameter values, b. performing a test of said IC operating under said current combination of X and Y parameter values;

c. if the current combination of X and Y parameter values for which the IC was last tested at step b was produced by increasing said Y parameter value, and the IC failed the test last performed at step b, then decreasing the X parameter value to produce a new current combination of X and Y parameter values, d. if the current combination of X and Y parameter values for which the IC was last tested at step b was produced by decreasing the Y parameter value, and the IC failed the test last performed at step b, then increasing the X parameter value in a fourth direction opposite to said third direction to produce a new current combination of X and Y parameter values, e. if the current combination of X and Y parameter values for which the IC was last tested at step b was produced by decreasing the X parameter value, and the IC failed the test last performed at step b, then increasing the Y parameter value to produce a new current combination of X and Y parameter values and returning to step b, f. if the current combination of X and Y parameter values for which the IC was last tested at step b was produced by increasing the X parameter value, and the IC failed the test last performed at step b, then decreasing the X parameter value to produce a new current combination of X and Y parameter values and returning to step b, g. if the current combination of X and Y parameter values for which the IC was last tested at step b was produced by decreasing the Y parameter value, and the IC passed the test last performed at step b, then increasing the X parameter value to produce a new current combination of X and Y parameter values and returning to step b, h. if the current combination of X and Y parameter values for which the IC was last tested at step b was produced by increasing the Y parameter value, and the IC passed the test last performed at step b, then decreasing the X parameter value to produce a new current combination of X and Y parameter values and returning to step b, i. if the current combination of X and Y parameter values for which the IC was last tested at step b was produced by decreasing the X parameter value, and the IC passed the test last performed at step b, then decreasing the Y parameter value to produce a new current combination of X and Y parameter values and returning to step b, j. if the current combination of X and Y parameter values for which the IC was last tested at step b was produced by increasing the X parameter value, and the IC passed the test last performed at step b, then increasing the X parameter value to produce a new current combination of X and Y parameter values and returning to step b.

18. The method in accordance with claim 17 further comprising the step of:

k. repeating steps b–j until producing at one of steps c–j a current combination of X and Y parameter values matching the combination of X and Y parameter values produced at step a.

* * * * *